(12) United States Patent
Kireev

(10) Patent No.: US 8,143,987 B2
(45) Date of Patent: Mar. 27, 2012

(54) STACKED DUAL INDUCTOR STRUCTURE

(75) Inventor: Vassili Kireev, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/755,781

(22) Filed: Apr. 7, 2010

(65) Prior Publication Data

US 2011/0248811 A1 Oct. 13, 2011

(51) Int. Cl.
*H01F 5/00* (2006.01)
*H01F 27/28* (2006.01)

(52) U.S. Cl. .................................... 336/200; 336/232

(58) Field of Classification Search .................. 336/200, 336/232
See application file for complete search history.

(56) References Cited

U.S. PATENT DOCUMENTS

| | | | | |
|---|---|---|---|---|
| 5,017,902 | A * | 5/1991 | Yerman et al. | 336/83 |
| 5,610,433 | A * | 3/1997 | Merrill et al. | 257/531 |
| 7,046,114 | B2 * | 5/2006 | Sakata | 336/200 |
| 7,265,433 | B2 * | 9/2007 | Pillai et al. | 257/531 |
| 2005/0258508 | A1 | 11/2005 | Sakamoto | |
| 2008/0169895 | A1 * | 7/2008 | Lee | 336/185 |
| 2009/0115562 | A1 | 5/2009 | Lee et al. | |

FOREIGN PATENT DOCUMENTS

| DE | 102006039733 A1 | 3/2007 |
|---|---|---|
| WO | WO 2008/014506 A2 | 1/2008 |

OTHER PUBLICATIONS

Galal, Sherif, "Broadband ESD Protection Circuits in CMOS Technology" *IEEE Journal of Solid-State Circuits*, Dec. 2003, pp. 2334-2340, vol. 38, No. 12, IEEE, Piscataway, New Jersey, USA.
Kossel, Marcel et al., "A T-Coil-Enhanced 8.5 Gb/s High-Swing SST Transmitter in 65 nm Bulk CMOS With < -16 dB Return Loss Over 10 GHz Bandwidth," *IEEE Journal of Solid-State Ciruits*, Dec. 2008, pp. 2905-2920, IEEE, Piscataway, New Jersey, USA.
Linten, D. et al., "A 4.5 kV HBM, 300 V CDM, 1.2 kV HMM ESD Protected DC-to-16.1 GHz Wideband LNA in 90 nm CMOS," *Proc. of the 2009 EOS/ESD Symposium*, pp. 5A.6-1 to 5A.6-6, ESD Association, Rome, New York, USA.
Pillai, Edward, et al. "Novel T-Coil Structure and Implementation in a 6.4-GB/s CMOS Receiver to Meet Return Loss Specifications," *2007 Electronic Components and Technology Conference*, pp. 147-153, IEEE, Piscataway, New Jersey, USA.
Zolfaghari, Alireza, "Stacked Inductors and Transformers in CMOS Technology" *IEEE Journal of Solid-State Circuits*, Apr. 2001, pp. 620-628, IEEE, Piscataway, New Jersey, USA.

* cited by examiner

*Primary Examiner* — Elvin G Enad
*Assistant Examiner* — Tsz Chan
(74) *Attorney, Agent, or Firm* — Kevin T. Cuenot; LeRoy D. Maunu

(57) ABSTRACT

The dual inductor structure can include a first inductor including a first plurality of coils. Each coil of the first plurality of coils can be disposed within a different one of a plurality of conductive layers. The coils of the first plurality of coils can be vertically stacked and concentric to a vertical axis. The dual inductor structure further can include a second inductor including a second plurality of coils. Each of the second plurality of coils can be disposed within a different one of the plurality of conductive layers. The coils of the second plurality of coils can be vertically stacked and concentric to the vertical axis. Within each conductive layer, a coil of the second plurality of coils can be disposed within an inner perimeter of a coil of the first plurality of coils.

16 Claims, 4 Drawing Sheets

STACKED DUAL INDUCTOR STRUCTURE

FIELD OF THE INVENTION

The embodiments disclosed within this specification relate to semiconductor integrated circuits (ICs). More particularly, the embodiments relate to a dual inductor structure implemented within an IC.

BACKGROUND

The frequency of input signals provided to semiconductor integrated circuits (ICs) has steadily increased over time. As IC input signals reach the radio frequency (RF) range with frequencies of approximately a gigahertz or more, complex impedances at IC input nodes become significant. The complex impedance of an IC input node can create impedance matching issues between the source of an input signal and an input node of the IC. An impedance mismatch between the source of the input signal and the input node of the IC can result in a percentage of the power of the input signal reflecting back from the input node to the source of the input signal. The reflection of input signal power creates inefficient delivery of input signal power to the input node.

Complex impedances are a function of multiple small capacitances and inductances associated with devices coupled to the input node of the IC. These small capacitances and inductances can include gate capacitances, inductances and capacitances associated with interconnect lines, packaging bond wire inductances, capacitance associated with input pads, capacitances associated with electrostatic discharge structures, and the like. Since the small inductances and capacitances that form the complex impedance become more significant at higher frequencies, impedance mismatches tend to increase at higher frequencies. These impedance mismatches lead to a reduction in bandwidth of the input node.

To avoid signal power loss, RF systems strive to appear as a purely resistive impedance, typically 50 ohms, at each RF input and RF output. To offset complex impedances at IC input nodes, a matching network with the intended function of cancelling complex impedances can be implemented at each IC input node. One such matching network is a T-coil network. In general, a T-coil network includes two inductors electrically coupled in series with an input load electrically coupled to the T-coil network at the coupling point between the two inductors. The T-coil network can reduce or cancel the complex impedances associated with a capacitive load at the IC input node. The implementation of a T-coil network at an input node of an IC can increase the bandwidth of that input node. In addition, the T-coil network can improve RF system performance at the input node, for example, by reducing return loss, decreasing bit error rates, increasing power gain, and the like.

SUMMARY

The embodiments disclosed within this specification relate to semiconductor integrated circuits (ICs) and, more particularly, to a dual inductor (DI) structure implemented within an IC. The DI structure can include a first inductor including a first plurality of coils. Each coil of the first plurality of coils can be disposed within a different one of a plurality of conductive layers. The first plurality of coils can be vertically stacked and concentric to a vertical axis. The DI structure further can include a second inductor including a second plurality of coils. Each coil of the second plurality of coils can be disposed within a different one of the plurality of conductive layers. The second plurality of coils can be vertically stacked and concentric to the vertical axis. Within each conductive layer, a coil of the second plurality of coils can be disposed within an inner perimeter of a coil of the first plurality of coils.

Each coil of the first plurality of coils can have a single turn and a same line-width as each other coil of the first plurality of coils. Each coil of the second plurality of coils can have at least one turn, a same number of turns, and a same line-width as each other coil of the second plurality of coils.

In one aspect, the DI structure can include a first terminal of the first inductor coupled to an input pad of the IC and a first terminal of the second inductor coupled to an internal node of the IC. The first terminal of the first inductor and the first terminal of the second inductor can be disposed in the conductive layer of the plurality of conductive layers that is farthest from a substrate of the IC. The DI structure further can include a second terminal coupled to the first inductor and the second inductor. The second terminal can be disposed on the conductive layer of the plurality of conductive layers that is closest to the substrate. The second terminal can electrically couple the first inductor and the second inductor in series.

In another aspect, the DI structure can include a first terminal of the first inductor coupled to an input pad of the IC and a first terminal of the second inductor coupled to an internal node of the IC. The first terminal of the first inductor and the first terminal of the second inductor can be disposed on the conductive layer of the plurality of conductive layers that is closest to a substrate of the IC. The DI structure further can include a second terminal coupled to the first inductor and the second inductor. The second terminal can be disposed on the conductive layer of the plurality of conductive layers that is farthest from the substrate. The second terminal can electrically couple the first inductor and the second inductor in series.

A coil of the first plurality of coils and a coil of second plurality of coils, within a same conductive layer, can be configured to flow current in a same direction. In another aspect, the line-width of the first plurality of coils can be greater than the line-width of the second plurality of coils. In that case, each coil of the second plurality of coils can include a greater number of turns per coil than each coil of the first plurality of coils to generate approximately a same inductive value for the first inductor and the second inductor.

The first plurality of coils of the first inductor can be coupled in series with at least one via. The second plurality of coils of the second inductor also can be coupled in series with at least one via. The inductive value of the first inductor can be approximately equal to the inductive value of the second inductor.

Another embodiment of the present invention can include a DI structure implemented within an IC. The DI structure can include a first conductive layer including a first coil of a first inductor and a first coil of a second inductor, wherein the first coil of the second inductor can be disposed within the first coil of the first inductor. The DI structure further can include a second conductive layer including a second coil of the first inductor and a second coil of the second inductor. The second coil of the first inductor can have a same line-width as, and can be vertically stacked directly beneath, the first coil of the first inductor. The second coil of the second inductor can have a same line-width as, and can be vertically stacked directly beneath, the first coil of the second inductor.

The DI structure can include a third conductive layer including a third coil of the first inductor and a third coil of the second inductor. The third coil of the first inductor can have the same line-width as, and can be vertically stacked directly beneath, the second coil of the first inductor. The third coil of the second inductor can have the same line-width as, and can be vertically stacked directly beneath, the second coil of the second inductor.

Each coil of the first inductor can be implemented as a coil including a single turn. Each coil of the second inductor can be implemented as a coil including at least one turn. Further, each coil of the second inductor can have a same number of turns. In another aspect, a coil of the first inductor and a coil of the second inductor, within a same conductive layer, can be configured to flow current in a same direction.

In one aspect, the DI structure can include a first terminal of the first inductor coupled to an input pad of the IC and a first terminal of the second inductor coupled to an internal node of the IC. The first terminal of the first inductor and the first terminal of the second inductor can be disposed in the conductive layer of the plurality of conductive layers that is farthest from a substrate of the IC. The DI structure further can include a second terminal coupled to the first inductor and the second inductor. The second terminal can be disposed in the conductive layer of the plurality of conductive layers that is closest to the substrate. The second terminal can electrically couple the first inductor and the second inductor in series.

In another aspect, the DI structure can include a first terminal of the first inductor coupled to an input pad of the IC and a first terminal of the second inductor coupled to an internal node of the IC. The first terminal of the first inductor and the first terminal of the second inductor can be disposed in the conductive layer of the plurality of conductive layers that is closest to the substrate. The DI structure further can include a second terminal coupled to the first inductor and the second inductor. The second terminal can be disposed on the conductive layer of the plurality of conductive layers that is farthest from the substrate. The second terminal can electrically couple the first inductor and the second inductor in series.

The coils of the first inductor can be coupled in series with at least one via. The coils of the second inductor also can be coupled in series with at least one via.

Another embodiment of the present invention can include a T-coil network circuit implemented within an IC. The T-coil network circuit can include a first inductor including a first terminal coupled to an input pad of the IC and a second terminal coupled to an input device of the IC. The first inductor can include a plurality of vertically stacked coils disposed within a plurality of conductive layers. The T-coil network circuit also can include a second inductor having a first terminal and a second terminal. The second terminal of the second inductor can be coupled to the second terminal of the first inductor. The second inductor can include a plurality of vertically stacked coils, wherein each coil of the second inductor includes at least one turn and has a same number of turns. Further, each conductive layer of the plurality of conductive layers can include a single coil of the second inductor disposed within a single coil of the first inductor. The DI structure also can include a termination resistor comprising a first terminal and a second terminal. The first terminal of the termination resistor can be coupled to the first terminal of the second inductor. The second terminal of the termination resistor can be coupled to a predetermined voltage potential within the IC.

In one aspect, the plurality of coils of the first inductor and the plurality of coils of the second inductor can be concentric to a vertical axis. A line-width of the first inductor can be greater than a line-width of the second inductor. In that case, each coil of the second inductor can include a greater number of turns than each coil of the first inductor to generate approximately a same inductive value for the first inductor and the second inductor.

DETAILED DESCRIPTION OF THE DRAWINGS

While the specification concludes with claims defining the features of the embodiments of the invention that are regarded as novel, it is believed that the embodiments of the invention will be better understood from a consideration of the description in conjunction with the drawings. As required, detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the embodiments of the invention.

The embodiments disclosed within this specification relate to semiconductor integrated circuits (ICs). More particularly, the embodiments relate to a dual inductor structure for use within an IC. The dual inductor structure can be implemented with both inductors constructed across two or more conductive layers available within an IC manufacturing process. The coils of each of the first inductor and the second inductor of the dual inductor structure can be vertically stacked in a manner that reduces an inter-winding capacitance of each inductor and that forces current to flow within an inner portion of the coils of each inductor at high frequencies.

When implemented within a T-coil network, for example, the low inter-winding capacitance of the dual inductor structure can increase a bandwidth improvement provided by the T-coil network when positioned at an IC input node configured to receive radio frequency (RF) signals. In addition, when the first inductor is positioned along an electrostatic discharge (ESD) path through the T-coil network, the vertically stacked dual inductor structure allows a line-width of the coils of the first inductor to be varied with minimal change in the inductive value of the first inductor. Widening the coils of the first inductor, for example, can increase the ESD performance of the first inductor during an ESD event.

Figure 1:
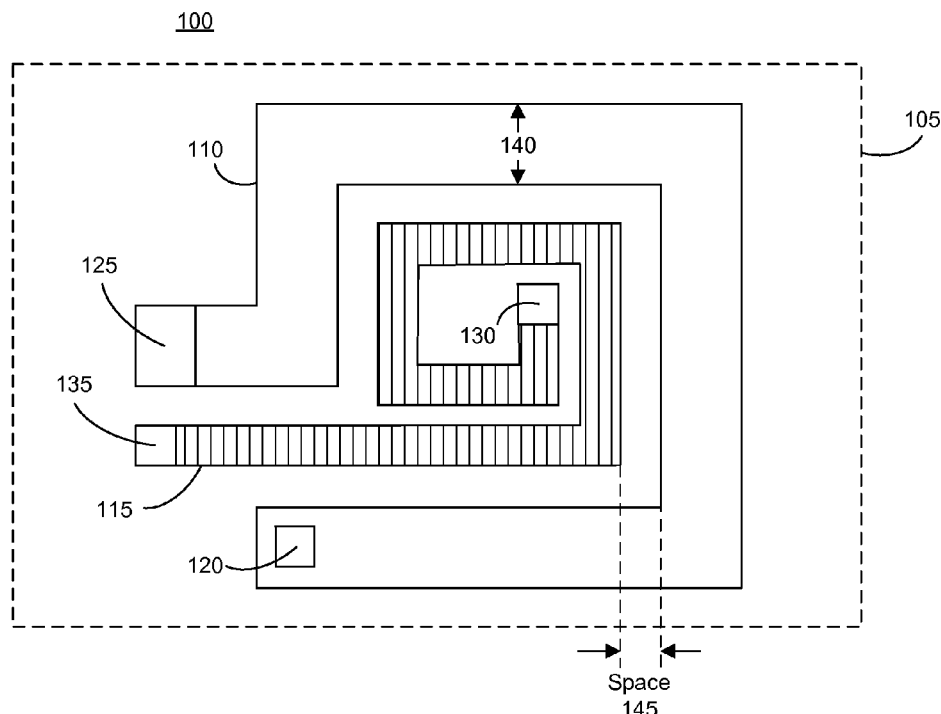
FIG. 1 is a first topographical view illustrating a dual inductor structure for use within a semiconductor integrated circuit (IC) in accordance with one embodiment of the present invention.

FIG. 1 is a first topographical view illustrating a dual inductor structure 100 for implementation within an IC in accordance with one embodiment of the present invention. FIG. 1 illustrates a first conductive layer (layer) 105 of dual inductor structure (DI structure) 100. The IC including DI structure 100 can include a plurality of conductive layers stacked above an IC substrate (not shown). As DI structure 100 can be implemented within two or more conductive layers of the IC, layer 105 can be the conductive layer of DI structure 100 that resides highest above the IC substrate.

Within layer 105, regions of conductive material of predetermined dimensions can be disposed within, and surrounded by, any of a variety of insulating materials, e.g., silicon dioxide. The conductive material within layer 105 can include signal routing interconnect metals as well as RF device manufacturing materials typically included in a modern IC manufacturing process. Metals such as copper, aluminum, tungsten, or silicided metal layers can be used to implement the conductive material of layer 105. Layer 105 can include a portion of inductor 110 and a portion of inductor 115.

Referring to FIG. 1, a first coil of inductor 110 is disposed within layer 105. The first coil of inductor 110 can include a via 120 and a node 125. Node 125 is a first terminal of inductor 110. Node 125 can electrically couple the conductive material used to implement, or route, the first coil of inductor 110 within layer 105 to other components of the IC in which DI structure 100 is implemented. For example, node 125 can be electrically coupled to an input pad of the IC. The first coil of inductor 110 on layer 105 can be implemented as a coil with a single turn. Each other coil of inductor 110 also can be implemented with a single turn as will be described in greater detail within this specification.

As used within this specification, the phrase "line-width" refers to the width of the routed conductive material used to implement each coil of inductors 110 and 115. For example, line-width 140 describes the width of the conductive material used to route the single turn coil of inductor 110 on layer 105. In one embodiment, line-width 140 can be constant, or substantially constant, over the entire length of the conductive material used to implement inductor 110 throughout each coil. In other embodiments, the line-width changes over the length of the conductive material.

Via 120 can represent one or more via structures typically used within an IC manufacturing process that electrically couples different, e.g., distinct, conductive layers within an IC. As these different conductive layers can be vertically separated by an insulating layer such as, for example, field oxide, via 120 can create a vertical conductive pathway, through the insulating layer, that electrically couples layer 105 to a conductive layer below layer 105. Via 120 can be a single via, coupling two adjacent conductive layers, or two or more vias vertically stacked to electrically couple non-adjacent conductive layers.

The phrase "non-adjacent conductive layers," as used within this specification, can refer to a first conductive layer and a second conductive layer that are separated by one or more additional conductive layers. For example, an IC manufacturing process can include four metal interconnect layers with the first metal layer being the lowest conductive layer above the IC substrate, and thus, the closest metal layer to the IC substrate. The fourth metal layer can be the highest conductive layer above the IC substrate, e.g., the farthest metal layer from the IC substrate in this example. Accordingly, the first metal layer and the second metal layer are adjacent and can be electrically coupled with a single via vertically coupling the first metal layer and the second metal layer. The fourth metal layer and the second metal layer, however, are non-adjacent conductive layers due to the third metal layer being disposed between the second metal layer and the fourth metal layer. The second metal layer and the fourth metal layer, being non-adjacent conductive layers, require a stack of two or more vias to be electrically coupled.

The first coil of inductor 115 can include a via 130 and a node 135. Node 135 is a first terminal of inductor 115 that can electrically couple the conductive material used to implement, or route, the first coil of inductor 115 to other circuit components with the IC in which DI structure 100 is implemented. The first coil of inductor 115 on layer 105 can be implemented as a coil with at least one turn. In addition, each other coil of inductor 115 can be implemented with at least one turn. Each coil of inductor 115 can include a same or equal number of turns, whether a fractional or a whole number of turns, as will be described in greater detail within this specification. As with inductor 110, a line-width of the conductive material used to implement inductor 115 can be constant throughout each coil of inductor 115.

As with via 120, via 130 can represent one or more via structures typically used within an IC manufacturing process to electrically couple various conductive layers within the IC manufacturing process. Via 130 can be a single via that electrically couples two adjacent metal layers, or two or more vertically stacked vias that electrically couple two non-adjacent conductive layers.

The first coil of inductor 115 is disposed within an inner perimeter of the first coil of inductor 110. The first coils of inductor 110 and inductor 115 are concentric. Space 145 represents a distance between the conductive materials of inductor 110 and inductor 115. Space 145 can be determined by a variety of factors including the desired inductive values for inductors 110 and 115, required magnetic coupling between inductor 110 and 115, die area provided for the implementation of DI structure 100, or minimum metal spacing rules for the manufacturing process in which DI structure 100 is implemented. Space 145 can be constant, or substantially constant, over the length of the outer edge of inductor 115 and the inner edge of inductor 110.

The inductive values of inductors 110 and 115, and the magnetic coupling between inductors 110 and 115, can be varied by altering the diameter of the outer perimeter of the coils of each of inductors 110 and 115. Altering the diameter of a coil can be accomplished by increasing the "hollow," or empty area, within the inner perimeter of the coil, and/or by increasing a spacing between turns of the coil. Varying the diameter results in a change in the overall length of the metal traces used to form inductor 110 and inductor 115. Additionally or alternatively, the inductive values of inductors 110 and 115 can be altered by varying the number of conductive layers, and thereby the number of coils, used to implement inductors 110 and 115. For example, the inductive values of inductors 110 and 115 can be increased by coupling an additional coil, at a lower conductive layer, to each of inductors 110 and 115. In this manner, the inductive value of inductors 110 and 115 can be adjusted by large discrete quantities, for example, by a third coil being added to a two coil inductor. Additionally or alternatively, the diameter of the outer perimeter of the coil within each conductive layer used to implement inductors 110 and 115 can be increased to increase the inductive values of inductors 110 and 115. In this manner, the inductive values of inductors 110 and 115, respectively, can be gradually adjusted over a continuous range. Correspondingly, inductive values of inductors 110 and 115 can be decreased by removing inductive layers or by decreasing the outer perimeter of the coils of each conductive layer.

It should be noted that a direction of a routing of the coils of inductors 110 and 115 must be such that current flow is in a same direction within the coils of inductors 110 and 115 when current flows in either direction between node 125 and node 135. Routing the coils of inductors 110 and 115 in such a manner creates magnetic coupling between inductors 110 and 115 within DI structure 100 during operation.

Figure 2:
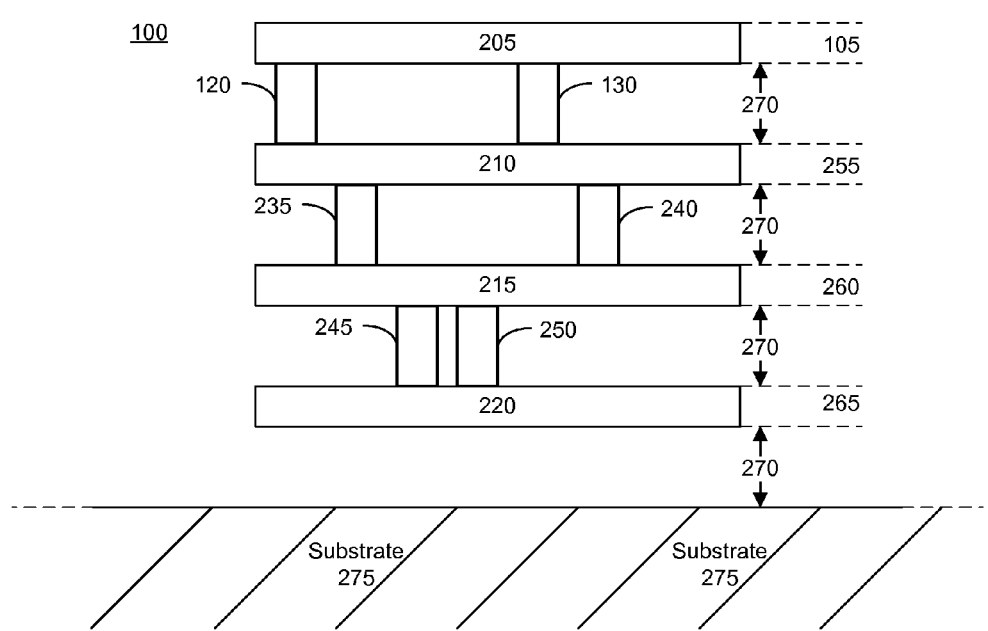
FIG. 2 is a side view illustrating the dual inductor structure of FIG. 1 in accordance with another embodiment of the present invention.

FIG. 2 is a side view illustrating DI structure 100 of FIG. 1 in accordance with another embodiment of the present invention. FIG. 2 illustrates the multilayer composition of inductors 110 and 115 within DI structure 100. As such, like numbers will be used to refer to the same items throughout this specification. Although embodied with four conductive layers in FIG. 2, any number of two or more conductive layers can be used to implement DI structure 100. As such, FIG. 2 is provided for clarity and descriptive purposes only and is not intended to limit the embodiments disclosed within this specification.

DI structure 100 can include coils 205, 210, 215, and 220, and vias 120, 130, 235, 240, 245, and 250. As shown in FIG. 2, only the coils of inductor 110 are visible as the coils of inductor 115 are concentrically located within the inner perimeter of inductor 110. As such, each of coils 205-220 represents a coil of inductor 110. Each of coils 205-220 resides on a different adjacent conductive layer within the IC. For example, coil 205 is disposed within layer 105. Coil 210 is disposed within layer 255. Coil 215 is disposed within layer 260. Coil 220 is disposed within layer 265.

Each of coils 205-220 is vertically separated from an adjacent coil, or substrate 275, by an insulating layer 270. Each insulating layer 270 can be formed of any of a variety of insulating materials available within a modern IC manufacturing process, e.g., silicon dioxide. Each of coils 205-220 can be concentric to a vertical axis as can be the coils of inductor 115. In one embodiment, the two or more of the coils of inductor 110 and/or inductor 115 can reside on non-adjacent conductive layers. More particularly, one or more conductive layers that do not include coils of either inductor 110 or inductor 115 can be disposed between two conductive layers that do include at least one coil of each of inductors 110 and 115.

Vias 120, 130, and 235-250 electrically couple the coils of each of inductors 110 and 115 through insulating layers 270. Insulating layers 270 electrically isolate the four conductive layers used to implement DI structure 100. Via 120 electrically couples coil 205 to coil 210. Via 235 electrically couples coil 210 to coil 215. Via 245 electrically couples coil 215 to coil 220. In this manner, vias 120, 235, and 245 create a continuous conductive pathway comprising coils 205-220 of inductor 110. Thus, inductor 110 extends through insulating layers 270 with vias 120, 235, and 245 electrically coupling the layers 105, 255, 260, 265 used to implement inductor 110.

Similarly, vias 130, 240, and 250 electrically couple the coils of inductor 115 (not shown) together to create a continuous conductive pathway that extends through insulating layers 270. The horizontal position of each of vias 130, 245, and 250 can be dependent upon the number of turns used to implement the coils of inductor 115. The locations of vias 120, 130, and 235-250, as illustrated within FIG. 2, are shown for descriptive purposes only and are not intended to limit the embodiments disclosed within this specification.

Typically, as the frequency of current flowing within an inductor increases to RF levels, a skin effect begins to influence the distribution of current flow within a conductor used to implement the inductor. The skin effect is the tendency of an alternating electric current to distribute itself within the conductor so that the current density near the surface of the conductor is greater than that at the core of the inductor. The electric current tends to flow at the "skin" or surface of the conductor, at an average depth called the skin depth. The skin effect causes an effective resistance of the conductor to increase with the frequency of the current as less of the cross-sectional area of the conductor supports current flow.

Thus, at high frequencies the inductive impedance of the conductor is large, thereby minimizing the value of the inductance of the conductor as current begins to flow largely through the surface of the conductor. The vertical stacking of the coils within DI structure 100, e.g., coils 205-220 and/or coils 405-420, can result in a strong magnetic coupling, i.e., where K is approximately equal to 1, between coils of DI structure 100 on adjacent conductive layers. As a result, a strong magnetic field can be created between coils vertically stacked on adjacent conductive layers that forces current to flow along the inner portion, or inner edge, of the conductive material used to implement each coil. In other words, within each coil, the magnetic field created between vertically stacked coils forces current to flow along the portion of the conductive material closest to the hollow center of the coil. The magnetic coupling created by vertically stacking coils within DI structure 100 begins at moderate RF frequencies, e.g., frequencies exceeding approximately 5 gigaHertz (GHz). With the current flow within each vertically stacked coil forced to the inner portion of the coil, the value of the inductance of an inductor implemented with stacked coils becomes relatively independent of the line-width of the coils.

When DI structure 100 is incorporated within a T-coil network within an IC, inductor 110 is typically electrically coupled to an input pad of the IC. As a result, an ESD event occurring at the input pad of the IC can result in ESD current flowing through inductor 110. Although a relatively high speed event, the frequencies associated with an ESD event typically are several orders of magnitude smaller than RF frequencies. Since ESD events are typically sub-RF frequencies events, skin effects do not significantly affect current flow within inductor 110 during ESD events.

With the value of the inductance of an inductor implemented with stacked coils being relatively independent of the line-width of the coils, the line-width of the coils of inductor 110 can be increased without significantly altering the inductive value of inductor 110 and coupling coefficient between coils. Due to magnetic field effects, the line-width of the coils of inductor 110 can be increased to improve the ESD current handling capability of inductor 110 with minimal changes in the inductive value of inductor 110. The same magnetic field effects also allow inductor 115 to be implemented with a narrower line-width than inductor 110 while providing a same inductive value as inductor 110.

In addition, the use of a stacked inductor structure as implemented within DI structure 100 provides lower inter-winding capacitance ($C_{BI}$) than a single layer inductor. Analysis of the stacked inductor structure reveals that a parasitic capacitance associated with the stacked inductor is greatly impacted by a voltage change appearing across each coil within the different conductive layers used to implement the stacked inductor. As a result, the contribution to $C_{BI}$ by a coil decreases with each descending conductive layer used to create the stacked inductor. When the stacked inductor is analyzed, an equation that estimates the value of $C_{BI}$ for a two level stacked inductor can be written as $C_{BI} = \frac{1}{12}(4C_1 + C_2)$, where $C_1$ represents the capacitance associated with the top coil of the inductor and $C_2$ represents the capacitance associated with the bottom coil of the stacked inductor. The equation for $C_{BI}$ for a two level stacked inductor reveals that the impact of $C_1$ on $C_{BI}$ is much greater than the impact of $C_2$.

A generalized equation for $C_{BI}$ for an n layer stacked inductor can be written as:

$$C_{BI} = \frac{1}{3n^2}\left(\sum_{i=1}^{n-1} Ci + Cn\right).$$

The preceding equation for $C_{BI}$ illustrates that increasing the number of conductive layers used to implement a stacked inductor significantly decreases the inter-winding capacitances of the stacked inductor. Whereas conventional dual inductor IC structures achieve values for $C_{BI}$ in the tens of femtoFarads (fF) range for a typical 1 nanoHenry (nH) IC inductor, dual inductor structure 100 can achieve values for $C_{BI}$ as low as 6 fF for a 1 nH IC inductor. The reduction of $C_{BI}$ provided by DI structure 100 increases the self-resonance frequency of each of inductors 110 and 115 within DI structure 100. Further details of the influence of reduced $C_{BI}$ on T-coil network performance is provided within the description of FIG. 5 within this specification.

Additionally, the vertical stacking of the coils of inductors 110 and 115 within a typical IC manufacturing process allows increased spacing between the coils of inductors 110 and 115 to be achieved without consuming additional horizontal die area. The increased spacing provided by vertically stacking the coils of each of inductors 110 and 115 on different conductive layers further reduces the value of $C_{BI}$ for inductors 110 and 115.

Figure 3:
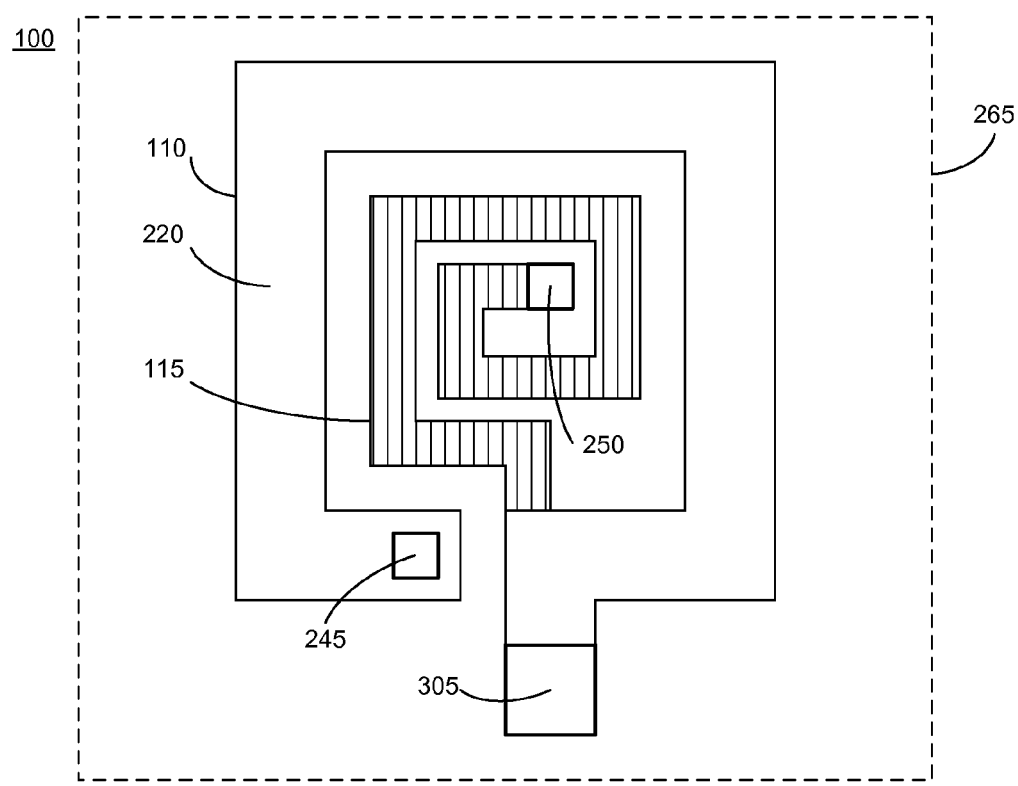
FIG. 3 is a second topographical view illustrating the dual inductor structure of FIG. 1 in accordance with another embodiment of the present invention.

FIG. 3 is a topographical view illustrating the DI structure 100 of FIG. 1 in accordance with another embodiment of the present invention. More particularly, FIG. 3 illustrates another conductive layer, i.e., layer 265, of DI structure 100. Layer 265 can be a conductive layer, of the two or more conductive layers used to implement DI structure 100, that is the lowest layer above the IC substrate. Thus, layer 265, of all the layers used to form DI structure 100, is closest to the IC substrate.

Referring to FIG. 3, a fourth coil of inductor 110, i.e., coil 220, is shown within layer 265. The coil 220 of inductor 110 can include via 245 and node 305. Node 305 is a common terminal between inductor 110 and inductor 115 that electrically couples inductor 110 and inductor 115 in series. Within a T-coil network, for example, node 305 can be an output terminal that electrically couples to an input device for which the T-coil network is implemented. As are the other coils of inductor 110, coil 220 of inductor 110 in layer 265 is implemented as a coil with a single turn.

Via 245 can electrically couple the single turn coil 220 of inductor 110 in layer 265 to the single turn coil of inductor 110 within the next highest adjacent layer, i.e., coil 215. Via 245 can be a single via, coupling the two adjacent conductive layers, or two or more vias, vertically stacked to electrically couple non-adjacent conductive layers as described.

The fourth coil of inductor 115 can include via 250. The fourth coil of inductor 115, disposed in layer 265, can be implemented as a coil with at least one turn. As noted, each coil of inductor 115 can include a same number of turns as each other coil of inductor 115. As with via 245, via 250 can be a single via, coupling two adjacent conductive layers, or two or more vias, vertically stacked to electrically couple non-adjacent conductive layers. The fourth coil of inductor 115 is disposed within the inner perimeter of, and concentric with, the fourth coil of inductor 110.

Figure 4:
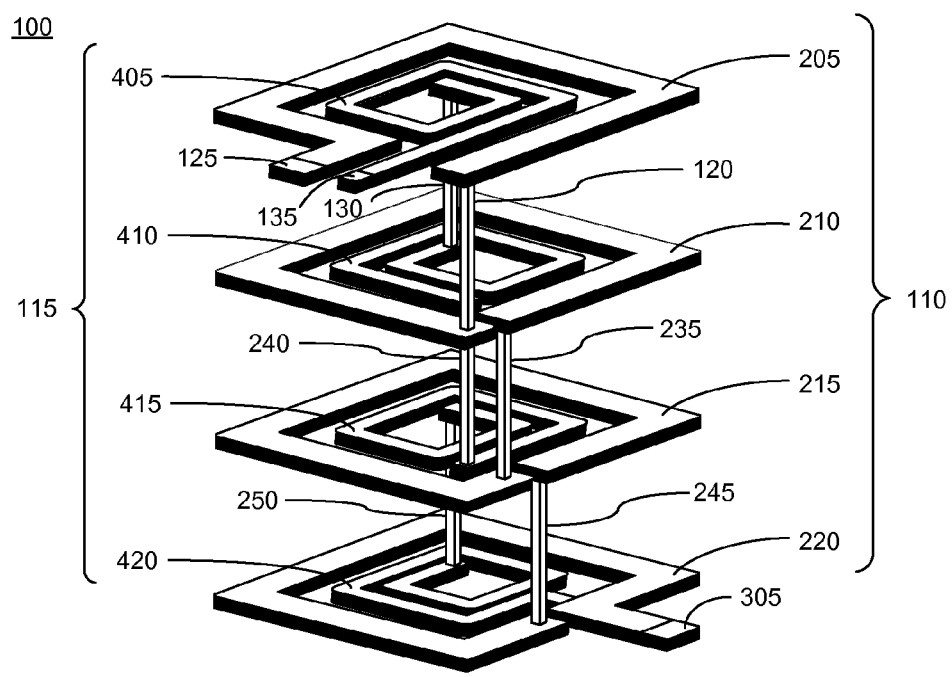
FIG. 4 is a three-dimensional perspective view illustrating the dual inductor structure of FIG. 1 in accordance with another embodiment of the present invention.

FIG. 4 is a three-dimensional (3-D) perspective view illustrating DI structure 100 of FIG. 1 in accordance with another embodiment of the present invention. FIG. 4 illustrates in 3-D the multilayer composition of DI structure 100. Although embodied with four conductive layers within FIG. 4, any number of two or more conductive layers can be used to implement DI structure 100. As such, the embodiment illustrated in FIG. 4 is provided for clarity and descriptive purposes only, and is not intended to limit the embodiments disclosed within this specification. DI structure 100 can include inductors 110 and 115.

As shown, inductor 110 includes coils 205, 210, 215, and 220. Node 125 is a first terminal of inductor 110. Each of coils 205-220 is formed by a single turn. Inductor 115 can include coils 405, 410, 415, and 420. Node 135 is a first terminal of inductor 115. In the pictured example, each of coils 405-420 is implemented with one and one half turns. Each of coils 405-420 of inductor 115 is disposed within an inner perimeter of coils 205-220, respectively, and further resides within a same conductive layer as each of coils 205-220 respectively.

Each of coils 205-220 and 405-420 is concentric with respect to a vertical axis to each other coil in DI structure 100. Coils 205-220 are vertically stacked, with each of coils 205-220 having a same outer perimeter diameter, a same constant line-width, and a single turn. Coils 405-420 are vertically stacked, with each of coils 405-420 having a same outer perimeter diameter, a same constant line-width, and a same number of turns. Inductors 110 and 115 can be implemented to have a same inductive value. Although each of coils 205-220 and each of coils 405-420 are implemented having a same outer perimeter diameter, a same constant line-width, and a same number of turns in FIG. 4, the outer perimeter diameter, line-width, and number of turns for each coil of coils 205-220 and coils 405-420 can vary according to the design requirements for DI structure 100. As such, the embodiment illustrated in FIG. 4 is provided for clarity and descriptive purposes only, and is not intended to limit the embodiments disclosed within this specification.

Although inductors 110 and 115 have a same inductive value, the line-width of each of coils 205-220 is greater than the line-width of each of coils 405-420 in order to provide inductor 110 with greater ESD current handling capability than inductor 115. The magnetic fields that result, in part, from the vertical stacking of the coils of each inductors 110 and 115 can allow a same inductive value to be implemented for inductors 110 and 115 without maintaining a same line-width for inductor 110 and inductor 115. The coils of inductor 115 can be implemented with one or more turns in order to attain an inductive value for inductor 115 that is approximately equal to the inductive value for inductor 110.

Vias 120, 130, and 235-250, or comparable interlayer interconnect structures, couple coils of each of inductors 110 and 115 as described. Node 305 is a second terminal common to both of inductors 110 and 115 that electrically couples inductor 110 and inductor 115 in series. Within each conductive layer, a coil of inductor 110 and a coil of inductor 115 are routed in opposing circular directions. When the routing of inductors 110 and 125 is configured in this manner, current flowing in either direction between node 125 and node 135 flows through the coils of inductors 110 and 115 in a same direction within each conductive layer.

Figure 6:
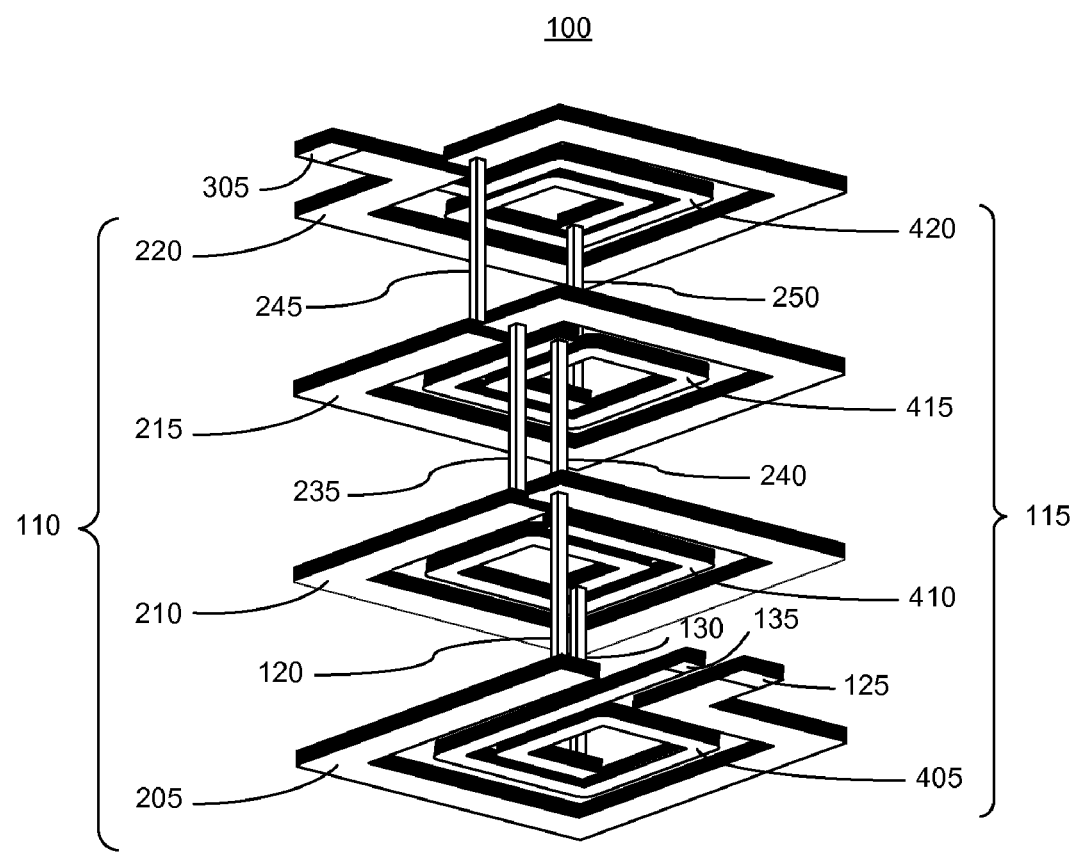
FIG. 6 is a three-dimensional perspective view illustrating the inductive structure of FIG. 1 in inverted form in accordance with another embodiment of the present invention.

In one embodiment, DI structure 100, as illustrated in FIG. 4, can be inverted. FIG. 6 is a three-dimensional perspective view illustrating DI structure 100 in inverted form in accordance with another embodiment. As shown, coils 205 and 405 can reside on the conductive layer used to implement DI structure 100 that resides closest to the IC substrate. Coils 210 and 410 can reside on the next highest conductive layer used to implement DI structure 100 that resides above coils 205 and 405. Further, coils 215 and 415 can reside on the next conductive layer used to implement DI structure 100 that resides above coils 210 and 410. Coils 220 and 420 can reside on the conductive layer used to implement DI structure 100 that resides farthest from the IC substrate. Accordingly, nodes 125 and 135 can reside on the conductive layer used to implement DI structure 100 that resides closest to the IC substrate. Node 305 can reside on the conductive layer used to implement DI structure 100 that resides farthest from the IC substrate.

Figure 5:
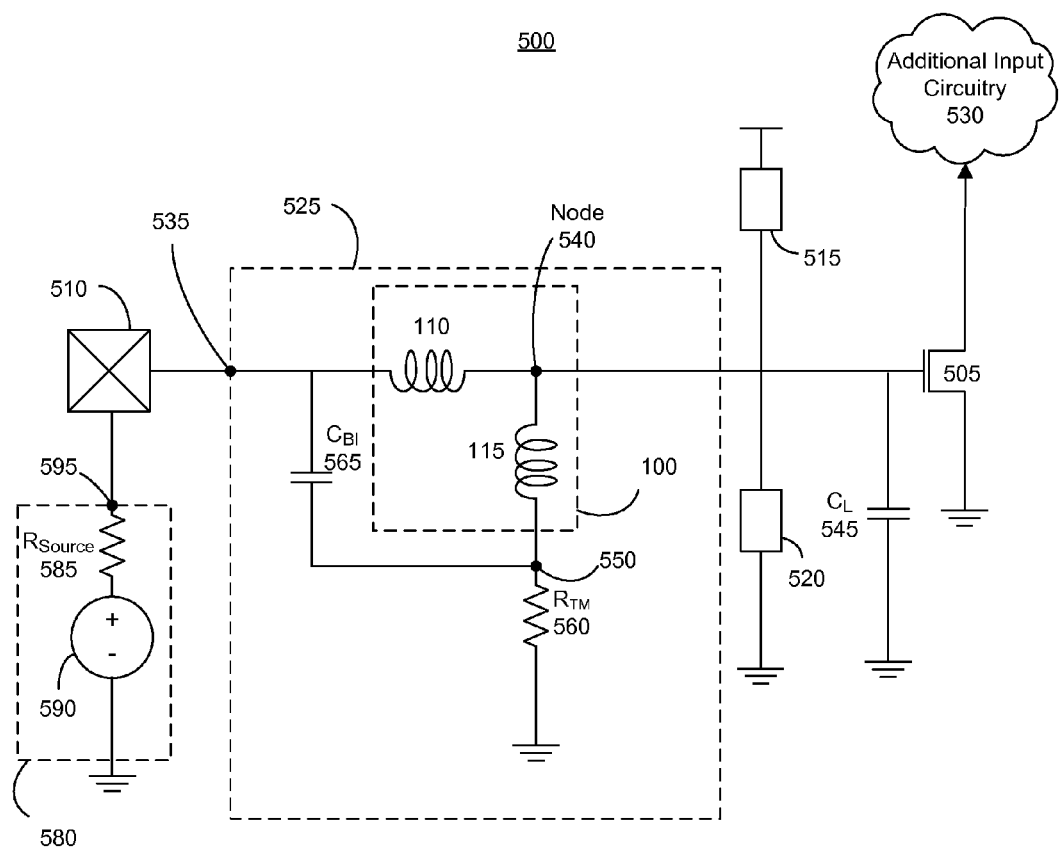
FIG. 5 is a circuit diagram illustrating a circuit including a T-coil network in accordance with another embodiment of the present invention.

FIG. 5 is a circuit diagram illustrating a circuit 500 including a T-coil network in accordance with another embodiment of the present invention. Circuit 500 illustrates an input node of an IC. As shown, a T-coil network has been implemented at the input node to improve matching between the impedance of the input node and the impedance of an output of a source providing an input signal to the input node. Circuit 500 can include DI structure 100 comprising inductors 110 and 115.

Circuit 500 can include an input device 505, an input pad 510, ESD devices 515 and 520, and T-coil network 525. Input device 505 can be any input device within an IC that is configured to receive an external high frequency signal as an input signal. Within FIG. 5, input device 505 is represented as a metal oxide field effect transistor (MOSFET). Since input device 505 can be implemented as any of a variety of devices available within an IC manufacturing process, the use of the MOSFET to represent input device 505 is not intended to limit the embodiments disclosed within this specification. Input device 505 can be electrically coupled to additional input circuitry 530 within the IC. Additional input circuitry 530 can represent additional devices or circuitry that can be electrically coupled to input device 505 for processing the input signal received via input pad 510.

As shown, a source 580 is electrically coupled to input pad 510 via an input pin of the IC (not shown). Source 580 can include a signal generator 590. The impedance of source 580, when looking into an output 595 of source 580, is represented by $R_{Source}$ 585. Source 580 can provide an input signal to input pad 510 through output 595. The input signal can be a RF input signal.

Input pad 510 can be any pad structure available within an IC manufacturing process that allows a signal external to the IC to be provided to the internal circuitry of the IC. Input pad 510 is electrically coupled to T-coil network 525 at T-coil input node (input node) 535. Input pad 510 can be part of a signal path coupling the input signal to input device 505.

ESD devices 515 and 520 are electrically coupled to a T-coil output node (output node) 540. Output node 540 provides signal to input device 505. In FIG. 5, ESD devices 515 and 520 can be any of a variety of devices, or circuits, available within an IC manufacturing process that are capable of providing protection from ESD events to input device 505.

T-coil network 525 can include DI structure 100, comprising inductors 110 and 115, and a termination resistor, denoted a $R_{TM}$ 560. T-coil network 525 can include various parasitic capacitances. One such parasitic capacitance, though not an actual circuit elements, is represented in FIG. 5 as $C_L$ 545. $C_L$ 545 represents a sum of the parasitic capacitances appearing at output node 540 and, thus, the input node of input device 505. Accordingly, $C_L$ 545 represents the load capacitance seen by T-coil network 525. $C_L$ 545 can include a variety of parasitic capacitances associated with devices electrically coupled to output node 540. For example, $C_L$ 545 can include gate capacitances associated with input device 505, capacitance associated with interconnect lines coupling devices to output node 540, capacitances associated with ESD devices 515 and 520, and the like. $C_L$ 545, along with various parasitic inductances and capacitances associated with the IC and IC packaging, can present a complex impedance to the source 580.

$C_{BI}$ 565 represents an inter-winding capacitance associated with inductors 110 and 115. As used within this specification, "inter-winding capacitance" refers to a parasitic capacitance caused by capacitive coupling between closely spaced windings of an inductor. Typically, inter-winding capacitance increases as the line-width of the windings of an inductor is increased. Correspondingly, inter-winding capacitance decreases as the line-width of the windings is decreased. Since each of inductors 110 and 115 is a vertically stacked inductor, the impact of line-width on inter-winding capacitance is significantly decreased. The value of $C_{BI}$ 565, which represents a parasitic capacitance and not an actual capacitor within the circuit 500, does not significantly increase or decrease as the line-width of the windings of each of inductors 110 and 115 is increased or decreased. Additionally, exclusive of the effect of line-width changes, the value of $C_{BI}$ 565 for vertically stacked inductors 110 and 115 is greatly reduced by distributing the coils of inductors 110 and 115 throughout the two or more conductive layers used to implement inductors 110 and 115.

When implemented at an input node, T-coil network 525 can cancel the complex impedances associated with input device 505 and present a predominantly resistive impedance to source 580, which generates a high frequency input signal to drive input device 505. Typically, input and output nodes of an RF system are designed to have a matched characteristic impedance of 50 ohms. Accordingly, $R_{Source}$ 585 and $R_{TM}$ 560 each can be implemented with characteristic impedances of approximately 50 ohms. T-coil network 525, when properly implemented, can have the effect of cancelling complex impedances seen by output 595 of source 580 so that the input node of the IC is seen by source 580 as purely resistive with $R_{Source}$ 585 being approximately equal to $R_{TM}$ 560. It should be appreciated that the values used with reference to FIG. 5 are for purposes of illustration only and are not intended to limit the embodiments disclosed herein.

The reduction of $C_{BI}$ 565 with vertically stacked inductors 110 and 115 can reduce a complex impedance associated with T-coil network 525, as well as the input node of the IC, and allow the IC input node to approach the maximum theoretical bandwidth expansion possible for a T-coil network. Use of the DI structure disclosed herein within T-coil network 525 can result in an increase of bandwidth that is approximately 2.7 times that of the same input node without the T-coil network. For example, whereas a conventional IC receiver circuit without a T-coil network achieves a maximum input bandwidth of approximately 12.7 GHz, a same IC receiver circuit implemented with a T-coil network having a three conductive layer DI structure can achieve an input bandwidth of approximately 30 GHz. In this example, the T-coil network increased bandwidth by a factor of approximately 2.4. Typically, T-coil networks that utilize conventional inductor structures for an IC achieve a bandwidth that is only approximately 1.6 times greater than an input node with no T-coil network.

Referring to FIG. 5, inductor 110 is electrically coupled at node 535 to the input pad 510 and at node 540 to input device 505 and ESD devices 515 and 520. During an ESD event, inductor 110 is in series with an ESD current path from input pad 510 through ESD device 515 and/or ESD device 520. In that case, the conductive material with which inductor 110 is implemented needs the capability to handle a peak current level that flows though inductor 110 during an ESD event. With the line-width of the stacked inductor structure used to implement inductor 110 having negligible impact on the inductive value of inductor 110, the line-width of inductor 110 can be increased to improve the ESD current handling capabilities of inductor 110 without significantly increasing the inductive value of inductor 110. Accordingly, the ESD performance of T-coil network 525 can be significantly improved.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A dual inductor structure implemented within a semiconductor integrated circuit (IC), the dual inductor structure comprising:
   a first inductor comprising a first plurality of coils;
   wherein each coil of the first plurality of coils is disposed within a different one of a plurality of conductive layers, wherein the first plurality of coils is vertically stacked and concentric to a vertical axis;
   a second inductor comprising a second plurality of coils, wherein each coil of the second plurality of coils is disposed within a different one of the plurality of conductive layers;
   wherein the second plurality of coils are vertically stacked and concentric to the vertical axis;
   wherein a line-width of the first plurality of coils is greater than a line-width of the second plurality of coils;
   wherein the first plurality of coils of the first inductor is coupled in series with at least one via and the second plurality of coils of the second inductor is coupled in series with at least one via; and
   wherein, within each conductive layer, a coil of the second plurality of coils is disposed within an inner perimeter of a coil of the first plurality of coils.

2. The dual inductor structure of claim 1, wherein each coil of the first plurality of coils comprises a single turn and a same line-width as each other coil of the first plurality of coils.

3. The dual inductor structure of claim 1, wherein each coil of the second plurality of coils comprises at least one turn, a same line-width, and a same number of turns as each other coil of the second plurality of coils.

4. The dual inductor structure of claim 1, further comprising:
   a first terminal of the first inductor coupled to an input pad of the IC;
   a first terminal of the second inductor coupled to an internal node of the IC;
   wherein the first terminal of the first inductor and the first terminal of the second inductor are disposed in the conductive layer of the plurality of conductive layers farthest from a substrate of the IC;
   a second terminal coupled to the first inductor and the second inductor;
   wherein the second terminal is disposed in the conductive layer of the plurality of conductive layers that is closest to the substrate;
   wherein the second terminal is configured to couple to a different internal node of the IC; and
   wherein the second terminal electrically couples the first inductor and the second inductor in series.

5. The dual inductor structure of claim 1, further comprising:
   a first terminal of the first inductor coupled to an input pad of the IC;
   a first terminal of the second inductor coupled to an internal node of the IC;
   wherein the first terminal of the first inductor and the first terminal of the second inductor are disposed in the conductive layer of the plurality of conductive layers closest to a substrate of the IC;
   a second terminal coupled to the first inductor and the second inductor;
   wherein the second terminal is disposed on the conductive layer of the plurality of conductive layers that is farthest from the substrate;
   wherein the second terminal is configured to couple to a different internal node of the IC; and
   wherein the second terminal electrically couples the first inductor and the second inductor in series.

6. The dual inductor structure of claim 1, wherein a coil of the first plurality of coils and a coil of the second plurality of coils, within a same conductive layer, are configured to flow current in a same direction.

7. The dual inductor structure of claim 1, wherein each coil of the second plurality of coils comprises a greater number of turns than each coil of the first plurality of coils to generate approximately a same inductive value for the first inductor and the second inductor.

8. The dual inductor structure of claim 1, wherein the inductive value of the first inductor is approximately equal to the inductive value of the second inductor.

9. A dual inductor structure implemented within a semiconductor integrated circuit (IC), the dual inductor structure comprising:
   a first conductive layer comprising a first coil of a first inductor and a first coil of a second inductor;
   wherein the first coil of the second inductor is disposed within the first coil of the first inductor;
   a second conductive layer comprising a second coil of the first inductor and a second coil of the second inductor;
   wherein the second coil of the first inductor has a same line-width as, and is vertically stacked directly beneath, the first coil of the first inductor;
   wherein a line-width of the each coil of the first inductor is greater than a line-width of each coil of the second inductor;
   wherein the coils of the first inductor are coupled in series with at least one via and the coils of the second inductor are coupled in series with at least one via; and
   wherein the second coil of the second inductor has a same line-width as, and is vertically stacked directly beneath, the first coil of the second inductor.

10. The dual inductor structure of claim 9, further comprising:
    a third conductive layer comprising a third coil of the first inductor and a third coil of the second inductor;

wherein the third coil of the first inductor has the same line-width as, and is vertically stacked directly beneath, the second coil of the first inductor; and wherein the third coil of the second inductor has the same line-width as, and is vertically stacked directly beneath, the second coil of the second inductor.

11. The dual inductor structure of claim 9:
wherein each coil of the first inductor is implemented as a coil comprising a single turn;
wherein each coil of the second inductor is implemented as a coil comprising at least one turn; and
wherein each coil of the second inductor has a same number of turns.

12. The dual inductor structure of claim 9, wherein a coil of the first inductor and a coil of the second inductor, within a same conductive layer, are configured to flow current in a same direction.

13. The dual inductor structure of claim 9, further comprising:
a first terminal of the first inductor coupled to an input pad of the IC;
a first terminal of the second inductor coupled to an internal node of the IC;
wherein the first terminal of the first inductor and the first terminal of the second inductor are disposed in the conductive layer of the plurality of conductive layers farthest from a substrate of the IC;
a second terminal coupled to the first inductor and the second inductor;
wherein the third terminal is disposed in the conductive layer of the plurality of conductive layers that is closest to the substrate; and
wherein the second terminal electrically couples the first inductor and the second inductor in series.

14. The dual inductor structure of claim 9, further comprising:
a first terminal of the first inductor coupled to an input pad within the IC;
a first terminal of the second inductor coupled to an internal node of the IC;
wherein the first terminal of the first inductor and the first terminal of the second inductor are disposed in the conductive layer of the plurality of conductive layers closest to a substrate of the IC;
a second terminal coupled to the first inductor and the second inductor;
wherein the second terminal is disposed on the conductive layer of the plurality of conductive layers that is farthest from the substrate; and
wherein the second terminal electrically couples the first inductor and the second inductor in series.

15. A T-coil network circuit implemented within a semiconductor integrated circuit (IC), the T-coil network comprising:
a first inductor comprising a first terminal coupled to an input pad of the IC and a second terminal coupled to an input device of the IC
wherein the first inductor comprises a plurality of vertically stacked coils disposed within a plurality of conductive layers;
a second inductor comprising a first terminal and a second terminal;
wherein the second terminal of the second inductor is coupled to the second terminal of the first inductor;
wherein the second inductor comprises a plurality of vertically stacked coils;
wherein each coil of the second inductor comprises at least one turn and has a same number of turns;
wherein each conductive layer of the plurality of conductive layers comprises a single coil of the second inductor disposed within a single coil of the first inductor;
wherein the plurality of coils of the first inductor and the plurality of coils of the second inductor are concentric to a vertical axis;
wherein a line-width of the first inductor is greater than a line-width of the second inductor;
a termination resistor comprising a first terminal and a second terminal; and
wherein the first terminal of the termination resistor is coupled to the first terminal of the second inductor and the second terminal of the termination resistor is coupled to a predetermined voltage potential within the IC.

16. The T-coil network circuit of claim 15:
wherein each coil of the second inductor comprises a greater number of turns than each coil of the first inductor to generate approximately a same inductive value for the first inductor and the second inductor.

* * * * *